United States Patent [19]

Sokolov et al.

[11] 4,147,915
[45] Apr. 3, 1979

[54] ELECTRON-BEAM APPARATUS FOR THERMAL TREATMENT BY ELECTRON BOMBARDMENT

[76] Inventors: Boris G. Sokolov, Nosovikhinskoe Shosse, 11, kv. 64, Zheleznodorozhny; Georgy F. Zaboronok, pereulok Obukha, 4, kv. 56, Moscow, both of U.S.S.R.

[21] Appl. No.: 825,167

[22] Filed: Aug. 12, 1977

Related U.S. Application Data

[63] Continuation of Ser. No. 491,556, Jul. 24, 1974, Pat. No. 4,095,083.

[51] Int. Cl.$^2$ ............................................. B23K 9/00
[52] U.S. Cl. .............................................. 219/121 EB
[58] Field of Search ............... 219/121 EB, 121 FM; 315/160, 166, 167, 168

[56] References Cited

U.S. PATENT DOCUMENTS 3,327,090   6/1967   Greene ........................... 219/121 E

*Primary Examiner*—J. V. Truhe
*Assistant Examiner*—Fred E. Bell
*Attorney, Agent, or Firm*—Haseltine, Lake & Waters

[57] ABSTRACT

An electron-beam apparatus for thermal treatment by electron bombardment, comprising a power supply, a vacuum chamber accommodating an object being treated, an electron gun including a cathode which is the source of an electron flow and an accelerating electrode which, together with the cathode, forms the electron flow into an electron beam directed to the object being treated, and a supplementary source of accelerating voltage, one leadout of which is connected to the cathode and the other leadout is coupled to the accelerating electrode, the cathode and the accelerating electrode being electrically insulated from each other and from the object being treated, and the power supply has one of its leadouts connected to the cathode and the other leadout connected to the object being treated.

The electron-beam apparatus for thermal treatment by electron bombardment is primarily intended for melting metals, evaporating various materials, treating ingots by fritting, treating material to required dimensions, etc., and can be advantageously employed in aviation, metallurgical and ship-building industries.

4 Claims, 2 Drawing Figures

ELECTRON-BEAM APPARATUS FOR THERMAL TREATMENT BY ELECTRON BOMBARDMENT

CROSS RELATED APPLICATION

This application is a continuation of co-pending application Ser. No. 491,556 filed July 24, 1974 now U.S. Pat. No. 4,095,083.

The present invention relates to apparatus used in electrothermics and electrophysical treatment of materials, and more particularly to electron-beam apparatus for thermal treatment by electron bombardment. The invention can most advantageously be used for melting metals, evaporating various materials, treating ingots by fritting, treating materrials to required dimensions, etc. in aviation, metallurgical and ship-building industries.

In conventional electron-beam apparatus for thermal treatment by electron bombardment, particularly in high-power apparatus, the cathode-emitter is subjected to intensive ion bombardment and is soon rendered inoperative. To minimize the effect of ion bombardment, the accelerating electrode is normally made as an ion screen insulated from the housing of the apparatus. Under the effect of the electric field set up by the power source, the positive terminal of which is connected to the accelerating electrode and the negative terminal is coupled to the housing of the apparatus, a major portion of the ions stop on their may to the accelerating electrode and do not reach the surface of the cathode.

A disadvantage inherent in the prior art electron-beam apparatus lies in that despite the improved protection of the cathode against ion bombardment, the power supply cannot be fully protected against discharges occuring in the electron gun, nor can the accelerating electrode be effectively protected from disintegration under the effect of said discharges. Hence, the power supply of a conventional electron-beam apparatus for thermal treatment by electron bombardment should be provided with additional protective devices, and the accelerating electrode is apt to become disabled.

Also known in the art are electron-beam apparatus for thermal treatment by electron bombardment, comprising a power supply, a vacuum chamber accomodating an object being treated and an electron gun which includes a cathode serving as the source of an electron flow, and an accelerating electrode forming, together with the cathode, the electron flow into an electron beam directed to the object being treated, the cathode and the accelerating electrode being electrically insulated from each other and from the object being treated, one leadout of the power supply being connected to the cathode and the other leadout being connected to the object being treated.

The above-mentioned electron-beam apparatus for thermal treatment by electron bombardment is disadvantageous in that with a view to effectively protecting its power supply against the discharge current originating in the electron gun, the power supply is additionally provided with reactors, spark gaps, high-speed maximum circuit breakers and grid blocking systems.

Another disadvantage of this apparatus is that in order to maintain a stable low pressure in the electron gun area with a view to minimizing discharges, a multistage evacuation system is used, which substantially complicates the apparatus.

The prior art apparatus are also disadvantageous in that they necessitate rectification of alternating current to energize high-power electron guns, in order to prevent the accelerating electrode from overheating and melting. This results in a substantially complicated power supply.

It is an object of the present invention to provide an electron-beam apparatus for thermal treatment by electron bombardment with effective protection of its power supply against discharges occurring in the electron gun, dispensing with complicated and costly devices, and in which use can be made of alternating voltage to energize high-power electron guns, as well as with effective protection of the cathode against ion bombardment.

This object is attained by that an electron-beam apparatus for thermal treatment by electron bombardment, comprising a power supply, a vacuum chamber accomodating an object being treated and an electron gun which includes a cathode serving as the source of an electron flow, and an accelerating electrode forming, together with the cathode, the electron flow into an electron beam directed to the object being treated, the cathode and an accelerating electrode are electrically insulated from each other and from the object being treated, one leadout of the power supply being connected to the cathode and the other leadout being connected to the object being treated, according to the invention, said apparatus is provided with a supplementary source of accelerating voltage, one leadout of which is connected to the accelerating electrode and the other leadout is connected to the cathode.

It is expedient that a resistor be inserted between the leadout of the supplementary source of accelerating voltage and the accelerating electrode to limit the current flowing when a discharge occurs between the cathode and the accelerating electrode.

It is also expedient that, with a view to protecting the cathode against ion bombardment, d-c sources be used as the power supply and the source of accelerating voltage, the accelerating electrode be connected to the positive terminal of the accelerating voltage source, and the negative terminal of the latter be connected to the cathode and the negative terminal of the power supply, the potential difference of the accelerating voltage source exceeding that of the power supply by no less than 50 V.

The use of the proposed electron-beam apparatus for thermal treatment by electron bombardment permits effective protection of the power supply against the discharge current originating in the electron gun, dispensing with such additional devices as reactors, spark gaps, high-speed maximum circuit breakers, etc., whereby the apparatus is rendered cheaper by 10 to 15%, the electron gun can be made without a multistage evacuation system, which makes the apparatus cheaper by another 10 to 15%, and makes it possible to use power current to energize high-power electron guns, which makes the apparatus still cheaper by an additional 8 to 12%. Thus, a total of 28 to 42% can be saved on the cost of the apparatus.

In the proposed apparatus, stable operation of the electron guns is ensured at a pressure at least 2 to 5 times higher than in conventional apparatus.

Further objects and advantages of the present invention will become apparent to those skilled in the art upon a further reading of this disclosure, particularly when viewed in the light of the accompanying drawings, wherein.

Figures 1, 2:
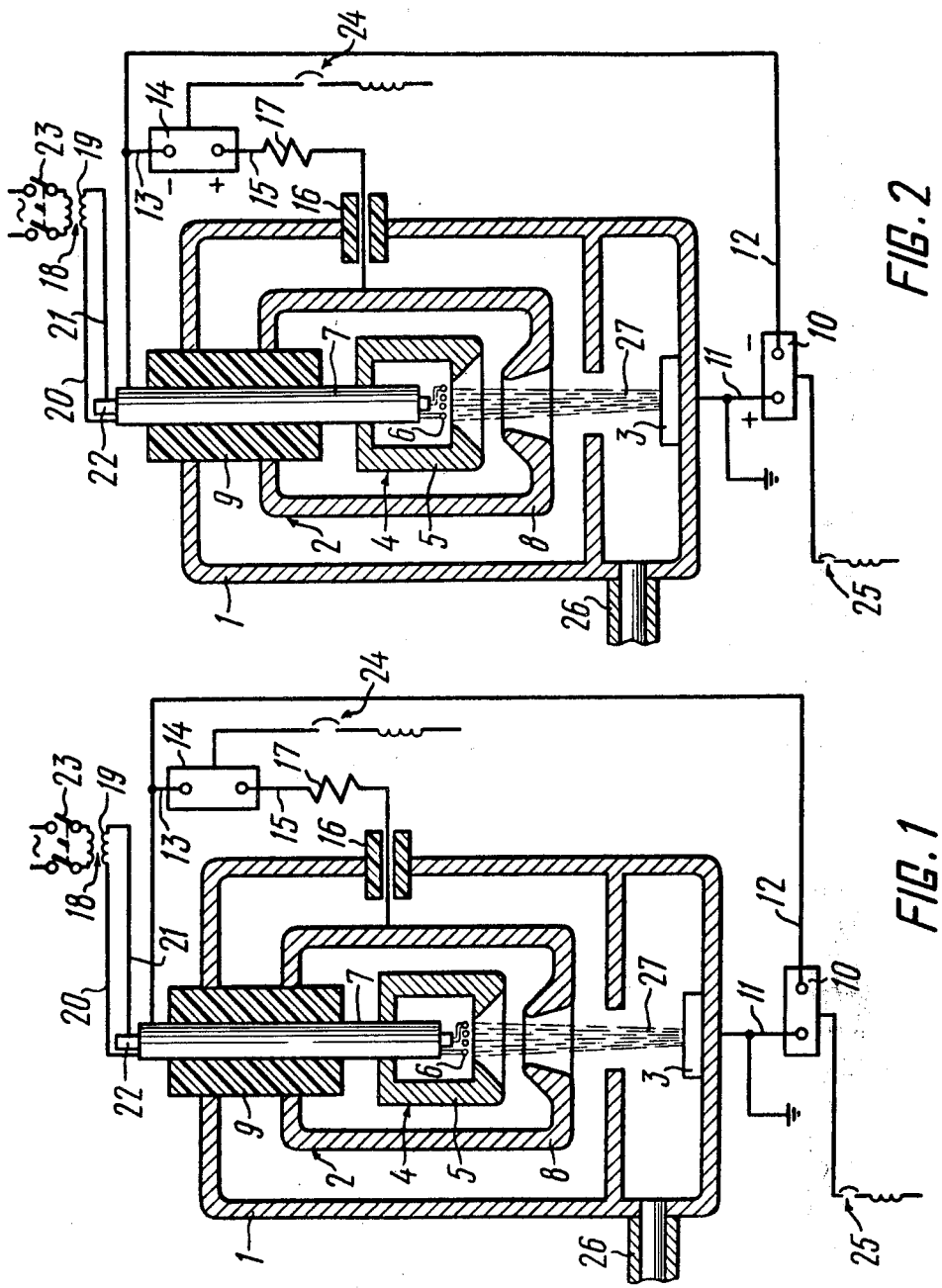
FIG. 1 is a longitudinal section view of one embodiment of the electron-beam apparatus for thermal treatment by electron bombardment of the present invention.
FIG. 2 is a longitudinal section view of another embodiment of the electron-beam apparatus for thermal treatment by electron bombardment of the present invention.

Referring now to the drawings, the electron-beam apparatus for thermal treatment by electron bombardment comprises a vacuum chamber 1 (FIG. 1) and an electron gun 2 with an object 3 to be treated placed under it. The electron gun 2 has a cathode 4 which serves as the source of an electron flow and is made up of a focusing electrode 5 and an emitter 6 made as a tungsten coil. The cathode 4 is secured inside the vacuum chamber 1 with the aid of a hollow rod 7 which serves as a tubular conductor through which current is carried to the emitter 6. An accelerating electrode 8 of the electron gun 2 is electrically insulated from the object 3 being treated by a high-voltage insulator 9.

A high-voltage (10 to 100 kV) power supply 10 arranged externally of the vacuum chamber 1 has a lead-out 11 thereof connected to the object 3 being treated through the casing of the vacuum chamber 1. Its other leadout 12 is connected to the cathode 4 through the hollow rod 7. The cathode 4 also has connected thereto through the hollow rod 7 a leadout 13 of a supplementary source 14 of accelerating voltage. The other leadout 15 of the supplementary source 14 of accelerating voltage is connected to the accelerating electrode 8 via a high-voltage insulator 16 and a high-resistance resistor 17. To heat the emitter 6, use is made of a transformer 18 whose secondary winding 19 has one terminal 20 thereof connected to the hollow rod 7 and the other terminal 21 connected to an insulated lead 22 arranged internally of the hollow rod 7.

The circuit of the transformer 18 is energized by means of a double-pole switch 23, and the voltage from the high-voltage power supply 10 is fed to the apparatus through a switch 25, while the voltage from the supplementary source 14 of accelerating voltage is fed to the apparatus through a switch 24. Through a pipe connection 26, the vacuum chamber 1 is connected to vacuum pumps (not shown).

In the electron-beam apparatus for thermal treatment by electron bombardment shown in FIG. 1, the power supply 10 and supplementary source 14 of accelerating voltage may be both d-c and a-c voltage sources.

The apparatus of FIG. 2 is similar to the one shown in FIG. 1 with the difference that d-c voltage sources are used as the power supply 10 and the supplementary source 14 of accelerating voltage. In this case, the potential difference between the cathode 4 and the accelerating electrode 8, provided by the accelerating voltage source 14, should be in excess of that supplied by the power supply 10 by no less than 50 V.

The electron-beam apparatus for thermal treatment by electron bombardment shown in FIG. 1 operates as follows.

The object 3 to be treated, e.g. a blank of metal to be melted, is placed in the vacuum chamber 1. The chamber 1 is evacuated through the pipe connection 26 to a blank-off pressure of about $1 \times 10^{-4}$ torr. Then, the high-voltage power supply 10 is switched on by means of the switch 25, the supplementary source 14 of accelerating voltage is switched on by means of the switch 24, and the accelerating voltage is applied to the electron gun 2 wherein an electric field is set up between the focusing electrode 5 and emitter 6, on the one hand, and the accelerating electrode 8, on the other, which field accelerates the electron flow and focuses it into an electron beam. The transformer 18 is energized by means of the switch 23 and its current heats the emitter 6. As the temperature of the latter reaches the thermionic emission level, an electron flow is created which is then formed into an electron beam 27 the electrons of which move in the electric field set up by the high-voltage power supply 10 and, finally, bombard and heat the object 3 being treated.

As the object 3, which is a metal blank, is being heated, especially at the moment it starts to melt, a great amount of gas is evolved from the molten metal. When gases reach the region of the cathode 4 and accelerating electrode 8, a discharge may occur between the two. In the prior art apparatus, the current of such a discharge may be ten to several hundred times greater than the current of the electron beam, which may adversely affect the power supply and cause destruction of the working surfaces of the electron gun electrodes. The resistance between the cathode 4 and the accelerating electrode 8 sharply falls, at the moment of the discharge, which results in a sharp increase in the current through the high-voltage power supply circuit 10 and may eventually lead to the power supply being disabled. In the proposed apparatus, however, this cannot happen. At the moment of the discharge, the current through the high-resistance resistor 17 in the circuit of the supplementary source 14 of accelerating voltage sharply increases.

This current causes a voltage drop across the high-voltage resistor 17 as a result of which a negative potential appears across the accelerating electrode 8, which potential is close to the potential of the cathode 4 and leads to the limitation of the development of the discharge between the accelerating electrode 8 and cathode 4. As a discharge appears between the accelerating electrode 8 and cathode 4 and the current through the circuit of the supplementary source 14 of accelerating voltage increases, the current through the circuit of the high-voltage power supply 10 decreases or discontinues altogether since the intensity of the electric field set up by the power supply 10 is not sufficient for electrons to be liberated from the emitter 6, and the intensity of the electric field set up by the supplementary source 14 of accelerating voltage has decreased as a result of the voltage drop across the high-resistance resistor 17. After the discharge discontinues, the current through the circuit of the supplementary source 14 of accelerating voltage diminishes and electrons can pass again from the emitter 6 to the object 3 being treated.

The electron-beam apparatus of FIG. 2 operates in a similar manner.

Under the effect of the accelerating voltage from the source 14, electrons from the cathode 4 rush towards the accelerating electrode 8, traverse the space confined within the accelerating electrode 8 and bombard the object 3 being treated. In order to prevent the ions in the space between the accelerating electrode 8 and the object 3 being treated from rushing towards the cathode 4, provision should be made that the accelerating voltage supplied by the source 14 to the area between the cathode 4 and accelerating electrode 8 is 50 V higher than the voltage supplied by the power supply 10. Since the power supply 10 is not connected to the accelerating electrode 8, discharges occurring in the electron gun 2 have no effect whatsoever on the power supply 10. To prevent discharges in the electron gun 2 from destroying the accelerating electrode 8, the resistance of the circuit of the supplementary source 14 of accelerating voltage should be made equal to scores and hundreds of kilohms. In this case, however, power losses are but minimal since the leakage current to the accelerating electrode 8, flowing through the circuit of the source 14, is insignificant.

The electron-beam apparatus for thermal treatment by electron bombardment of the present invention can be used for melting, welding and sputtering metals and metalloids, treating the surface of ingots by fritting, and treating materials to required dimensions.

The use of the proposed electron-beam apparatus makes it possible to ensure full protection of high-voltage power supplies against electric discharges by means of the supplementary source 14 of accelerating voltage, the power of which is hundreds of times lower.

The discharge current in the proposed apparatus, namely the discharge current through the circuit of the high-voltage power supply 10 which is the main source of power, does not exceed the rated electron beam current, which precludes any damage to or destruction of the electron gun electrode surface.

As in the proposed electron-beam apparatus the discharge current is limited at the initial stage of development of the discharge, the electron gun 2 operates stably, the pressure in the vacuum chamber being at least 2 to 5 times higher than the pressure required for stable operation of the electron gun of the prior art apparatus. The vacuum system of the proposed electron-beam apparatus has been substantially simplified by reducing the number of stages of evacuation of the vacuum chamber 1.

In the herein-disclosed apparatus, the high-voltage power supply 10 may energize a number of electron guns at one time, though provision can be made for separate control of guns, the operation of each individual gun in no way affecting that of the others.

For the first time, it has become possible to make wide use of alternating current for high-power electron-beam apparatus.

What is claimed is:

1. An electron-beam apparatus for thermal treatment by electron bombardment, comprising:
   a vacuum chamber accomdating an object being treated;
   an electron gun housed in said vacuum chamber and including a cathode which is the source of an electron flow, and an accelerating electrode forming, together with said cathode, said electron gun, said cathode and said accelerating electrode forming said electron flow into an electron beam directed to said object being treated, and being electrically insulated from each other and from said object being treated;
   a first power source one leadout of which is connected to said cathode and the other leadout is connected to said object being treated; and
   a supplementary source of accelerating voltage one leadout of which is connected to said cathode in common with said one leadout of said first power source and the other leadout of which is connected to said accelerating electrode.

2. An electron-beam apparatus for thermal treatment by electron bombardment as claimed in claim 1, comprising wherein a high resistance resistor is inserted between said leadout of said supplementary source of accelerating voltage and said accelerating electrode.

3. An electron-beam apparatus for thermal treatment by electron bombardment as claimed in claim 1, wherein the potential difference created by said accelerating voltage source between said cathode and said accelerating electrode exceeds that created by said first power source by no less than 50 V.

4. An electron-beam apparatus for thermal treatment by electron bombardment as claimed in claim 1, comprising an emitter adjacent said cathode, and independent heating means for said emitter.

* * * * *